(12) United States Patent  
Alvarez et al.

(10) Patent No.: US 11,307,163 B2  
(45) Date of Patent: Apr. 19, 2022

(54) CARBON NANOTUBE BASED REFERENCE ELECTRODES AND ALL-CARBON ELECTRODE ASSEMBLIES FOR SENSING AND ELECTROCHEMICAL CHARACTERIZATION

(71) Applicant: University of Cincinnati, Cincinnati, OH (US)

(72) Inventors: Noe Alvarez, Cincinnati, OH (US); Daoli Zhao, I, Cincinnati, OH (US); William Heineman, Cincinnati, OH (US); Vesselin Shanov, Cincinnati, OH (US); David Siebold, Cincinnati, OH (US)

(73) Assignee: University of Cincinnati, Cincinnati, OH (US)

( * ) Notice: Subject to any disclaimer, the term of this patent is extended or adjusted under 35 U.S.C. 154(b) by 300 days.

(21) Appl. No.: 15/625,249

(22) Filed: Jun. 16, 2017

(65) Prior Publication Data

US 2017/0363563 A1 Dec. 21, 2017

Related U.S. Application Data

(60) Provisional application No. 62/350,854, filed on Jun. 16, 2016.

(51) Int. Cl.
*G01N 27/30* (2006.01)
*C23C 14/06* (2006.01)
(Continued)

(52) U.S. Cl.
CPC ......... *G01N 27/308* (2013.01); *C01B 32/158* (2017.08); *C01B 32/162* (2017.08);
(Continued)

(58) Field of Classification Search
CPC ...... G01N 27/42; G01N 27/308; G01N 27/26; G01N 27/327; G01N 27/3272; G01N 27/40; G01N 33/4836; A61B 2562/0285; A61B 2562/066; A61B 2562/046; A61B 2562/125; C23C 16/08; C23C 14/2202; C23C 14/36; C01B 32/158
See application file for complete search history.

(56) References Cited

U.S. PATENT DOCUMENTS

2006/0237313 A1* 10/2006 Kiesele ................ G01N 27/404  
204/412  
2009/0198117 A1* 8/2009 Cooper .............. A61B 5/14532  
600/347

(Continued)

OTHER PUBLICATIONS

Zhao et al. (Electroanalysis 26, 488-496) (Year: 2014).*  
Zhang et al. (Adv. Mater. 22, 3027-3031) (Year: 2010).*  
Guo et al. (Electroanalysis 23, No. 5, 1252-1259) (Year: 2011).*

*Primary Examiner* — Gurpreet Kaur  
(74) *Attorney, Agent, or Firm* — Dinsmore & Shohl LLP

(57) ABSTRACT

A carbon nanotube-based reference electrode and an all-carbon nanotube microelectrode assembly for electrochemical sensing and specialized analytics are disclosed, along with methods of manufacture, and applications including detection of ionic species including heavy metals in municipal and environmental water, monitoring of steel corrosion in steel-reinforced concrete, and analysis of biological fluids.

10 Claims, 12 Drawing Sheets

(51) Int. Cl.
*C23C 16/08* (2006.01)
*C01B 32/158* (2017.01)
*D01F 9/12* (2006.01)
*C01B 32/162* (2017.01)
*G01N 27/42* (2006.01)

(52) U.S. Cl.
CPC .......... *C23C 14/0694* (2013.01); *C23C 16/08* (2013.01); *D01F 9/12* (2013.01); *G01N 27/42* (2013.01); *C01B 2202/36* (2013.01)

(56) References Cited

U.S. PATENT DOCUMENTS

2012/0138458 A1* 6/2012 Lee .................... G01N 27/4145
  204/403.06
2016/0340193 A1* 11/2016 Uejima ................ C01B 32/159

* cited by examiner

CARBON NANOTUBE BASED REFERENCE ELECTRODES AND ALL-CARBON ELECTRODE ASSEMBLIES FOR SENSING AND ELECTROCHEMICAL CHARACTERIZATION

PRIORITY CLAIM

This application claims priority to U.S. Provisional application Ser. No. 62/350,854, filed Jun. 16, 2016, the entire disclosure of which is incorporated herein.

GOVERNMENT INTEREST

This invention was made with government support under P30ES006096 awarded by the National Institute of Environmental Health Sciences. The U.S. government has certain rights in the invention.

BACKGROUND

Heavy metals and organic pollution including lead, arsenic, zinc, cadmium and copper in the environment, are a major concern all over the world. Human exposure to these contaminants can cause a variety of adverse health impacts. For example, cadmium exposure can lead to kidney damage, increases the risk of cancer, and causes progressively severe and irreversible renal damage, as well as mineral and calcium metabolism. People who have had extended exposure to lead may suffer from memory deterioration, reduced ability to comprehend, and in children may lead to diminished intellectual capacity. Although copper and zinc are essential trace elements for the normal metabolism of many living organisms, as well as for cellular functions, excess zinc and copper are known to be harmful to a number of metabolic processes. Thus, monitoring and detecting of these trace metals are an important aspect of water quality control in industrial processes and facilities.

Conventional methods for detecting these metals including atomic absorption spectroscopy (AAS), inductively coupled plasma-optical emission spectrometry (ICP-OES) and inductively coupled plasma-mass spectrometry (ICP-MS) have been well developed. Although these methods are highly sensitive and reliable, they require a controlled laboratory setting and sophisticated instrumentation, which results in high cost and long turnaround time for sample analysis. In addition, some of these techniques can measure only one element at a time. Therefore, alternative techniques for simultaneous detection of multiple heavy metal ions are desirable.

Stripping voltammetry for the detection of trace metal ions offers high sensitivity, selectivity, simultaneous multi-element determination, simplicity, relatively low cost, and portability, which has attracted attention. Its remarkable sensitivity is attributed to the combination of the effective pre-concentration step with advanced measurement procedures that generate an extremely favorable signal-to-background ratio by pulsing the potential (see, e.g. Wang, J., et al., *Bismuth-coated carbon electrodes for Anodic Stripping Voltammetry*. Anal. Chem, 2000. 72: p. 3218-3222, Kissinger, P et al. *Laboratory Techniques in Electroanalytical Chemistry* ed. N. Y. C. Dekker 1996, and Zhao, D., et al., *Electrospun Carbon Nanofiber Modified Electrodes for Stripping Voltammetry*. Analytical Chemistry, 2015. 87(18): p. 9315-9321, all of which are incorporated herein by this citation).

The success of Anodic Stripping Voltammetry (ASV) is highly dependent on the choice of electrode set (a set comprises at least one working electrode, at least one reference electrode, and at least one auxiliary electrode). The electrodes must be chemically inert within the applied potentials to avoid any interference. Commercial sets of electrodes typically include a glassy carbon as a working electrode, a liquid electrolyte filled Ag/AgCl electrode as a reference electrode, and a platinum wire as an auxiliary electrode.

Glassy carbon is an inert "working electrode" material; however it has a relatively low surface area and limited electrical conductivity. Thin mercury film electrode (TMFE) and the hanging mercury drop electrode (HMDE) have been used extensively due to their superior electroanalytical performance. However, the toxicity of mercury and the related regulations and occupational health considerations severely restrict the use of mercury as an electrode material. Other materials, including bare carbon, glassy carbon, gold, and iridium, have been used to replace mercury-based electrodes; however their application still is limited by their surface area.

Reference electrodes based on Ag/AgCl are widely used because of their easy fabrication and freedom from toxicity. A substantial drawback of conventional reference electrodes, however, is their liquid electrolyte filling. Such electrodes are position-dependent, mechanically fragile and suitable to only a limited extent for miniaturization or applications at high pressure and temperature. Although very stable and reliable, such reference electrodes require frequent maintenance, such as electrolyte refills. Solid-state reference electrodes based on Ag/AgCl provide advantages over the conventional liquid-junction type reference electrode. They do not suffer from the internal filling solution leakage and storage problem of the internal filling solution because no liquid phase is used. They are also easily fabricated with miniature dimensions, which render them useful for in vivo studies. Solid reference electrodes are heat and pressure resistant up to 140° C. and 16 bar overpressure, respectively. Conventional substrates for Ag/AgCl film include platinum, glassy carbon, graphite paste, copper, silver wires and silicon plates. Nonetheless, currently available solid state Ag/AgCl reference electrodes are expensive to manufacture and suffer from durability issues under high pressure and/or temperatures.

The auxiliary electrode is another important component in a three electrode electrochemical cell. Conventionally, Pt wire has been used for the auxiliary electrode. Carbon materials are attractive for use as a counter electrode, instead of Pt, owing to the lower cost, higher conductivity, and corrosion resistance to iodide ions in dye-sensitized solar cells (DSSCs). So far, however, the application of the CNT-based auxiliary electrode has been restricted to DSSCs (Fan, B., et al., *Conducting polymer/carbon nanotube composite as counter electrode of dye-sensitized solar cells*. Applied Physics Letters, 2008. 93(14): p. 143103).

Several scientific publications have suggested the use of carbon nanotubes (CNT) as heavy metal sensors. In some cases, CNT have been employed as pre-concentrators or sorbants of heavy metals, where the large surface are of the CNT has contributed to metal deposition on their surface (see, e.g. Wanekaya, A. K., *Applications of nanoscale carbon-based materials in heavy metal sensing and detection*. Analyst, 2011. 136: p. 4383-4391).

CNTs have also been used as electrically conducting materials for sensing applications; however the electrode design and manufacturing processes employ powdered CNT material dispersed in solvents (see Wanekaya, A. K., *Applications of nanoscale carbon-based materials in heavy metal sensing and detection*. Analyst, 2011. 136: p. 4383-4391, and Prasek, J., et al., *Carbon nanotube based sensor for heavy metal detection*. Electronics, 2005 Sozopol). According to the investigators in Achterberg and Wang, (*Stripping voltammetry for the determination of trace metal speciation and in-situ measurements of trace metal distributions in marine waters*. Anal. Chim. Acta, 1999. 400: p. 381-397, and *Mercury free disposable lead sensors based on petentiometric stripping analysis at gold-coated screen-printed electrodes*. Anal. Chem, 1993. 65: p. 1529-1532, respectively), CNTs are dissolved in solution, and then cast as a thin film to form electrodes. The published process, however, introduces additional impurities that affect reliability.

A key component for an all-carbon electrochemical sensor is the RE, and fabrication of a CNT-based RE has been more challenging. Clearly, a major benefit to an all-CNT electrode set is achieving a significant size reduction, along with corrosion resistance and chemical stablity that permits utility in a wider variety of applications. For example, electrochemical analysis typically must rely on bulky commercial electrodes that demand 10 to 15 mL minimum sample volumes. Biofluids, such as sweat, tears, and saliva, however, are generally only available in limited volumes at point-of-care and urgent-need sites. Ideally, analysis could be conducted on sample volumes of only several mL or even less. Portability in the area of personal diagnostics and triage is also a critical need, and a microelectrode electrochemical set would allow more simple and routine testing of body fluids.

An ideal solid-state RE should have the following characteristics: it should be rugged and maintenance-free, it should have a low-temperature coefficient, and it should possess stability and reliability when compared to a standard RE such as liquid based saturated calomel electrode (SCE). Further, it should not lead to undesirable contamination due to the medium or its surroundings. The potential should be stable and reproducible even after small electric current flow, and functioning should not be influenced by pH, or concentration of oxygen nor redox species in solution.

An exemplary industry with a high demand for improved solid state REs is steel corrosion monitoring in concrete structures. Corrosion in concrete reinforcement-steel is an electrochemical process that is a major problem with significant economic impact worldwide, since it affects the structural integrity of structures. When structural concrete is exposed to chemical environments such as sea water, chemical deterioration occurs due to the acidic or alkaline reactions. This industry requires a reliable solid-state RE which can be embedded in concrete for long-term monitoring of corrosion.

Currently, ASTM C876 specifies the use of Cu/CuSO4 as a reference electrode for measurement of steel potential in concrete; however the leakage of copper sulfate solution can cause contamination of concrete, and the IR drop within the concrete cover may lead to erroneous results. The liquid based saturated calomel electrode (SCE) is conventionally used in alkaline environments due to its compatibility and easy use, however, this electrode is prepared from mercury and hence the potential for leakage poses an environmental contamination/pollution hazard.

The long-term stability of reference electrodes is a critical issue. Glass membrane electrodes are not fit for in situ measurements at the steel/concrete interface due to the very high alkaline environment at the interface and their fragility. Ag/AgCl pseudo REs are commonly used in concrete structures to measure the rebar corrosion potential, but stability results are inconsistent for mortar-embedded Ag/AgCl REs. An ideal embeddable electrode for concrete steel monitoring must be stable, invariant to chemical and thermal changes in concrete, able to pass small currents with a minimum of polarization and hysteresis effects, display long-term performance without routine maintenance, be cost effective and its manufacturing and operation should be environmentally safe.

As is readily apparent from the foregoing, there is a compelling need for improved electrochemical electrode sets that overcome the these and other deficiencies of the current commercially available electrode sets and reference electrodes in the art.

SUMMARY

Accordingly, embodiments of the present invention provide electrodes and electrode assemblies based on fabrication of CNTs into usable macroscopic forms such as fibers and films, which can be tooled into electrodes for electrode assemblies.

One embodiment is directed to an electrode assembly for electrochemical sensing comprising a reference electrode comprising a carbon nanotube (CNT) core consisting of substantially pure CNT. The use of the term "core" herein should not be construed as implying any additional materials/layer/coating, and includes within it scope bare, or pristine CNT.

According to another embodiment, an all-carbon electrode assembly of at least three electrodes, including a working electrode, an auxiliary electrode, and a reference electrode is provided, and each electrode comprises a substantially pure CNT core.

Another embodiment provides methods for qualitatively or quantitatively detecting one or more ionic species in a sample. The methods comprise use of embodiments of the inventive electrode assembly in an anodic stripping voltammetry (ASV) analysis of the sample. Exemplary samples include municipal water, environmental water, or a sample derived from a hard surface.

Other embodiments are directed to methods for fabricating a particular CNT core architecture. The methods comprise: synthesizing a vertically aligned CNT array; and spinning the CNT array into a desired core architecture.

Another embodiment provides an electrochemical sensing device comprising an electrode assembly. The electrode assembly comprising a reference electrode fabricated with a CNT core, an auxiliary electrode fabricated with a CNT core, or both a reference and an auxiliary electrode fabricated with CNT cores, all cores consisting of CNT in a thread or sheet architecture.

Another embodiment is directed to methods for conducting an electrochemical analysis of a fluid sample utilizing various embodiments of the inventive electrode assembly. The fluid sample may have a volume of less than 5, less than 4, less than 3, or less than 2 mL.

Yet another embodiment is directed to methods for monitoring corrosion of steel embedded in a substrate using an embodiment of the electrode assembly, and in particular a CNT reference electrode, according to the invention.

These and other aspects and features of the invention will be further clarified by reference to the figures and detailed description below.

DETAILED DESCRIPTION

Figure 1A:
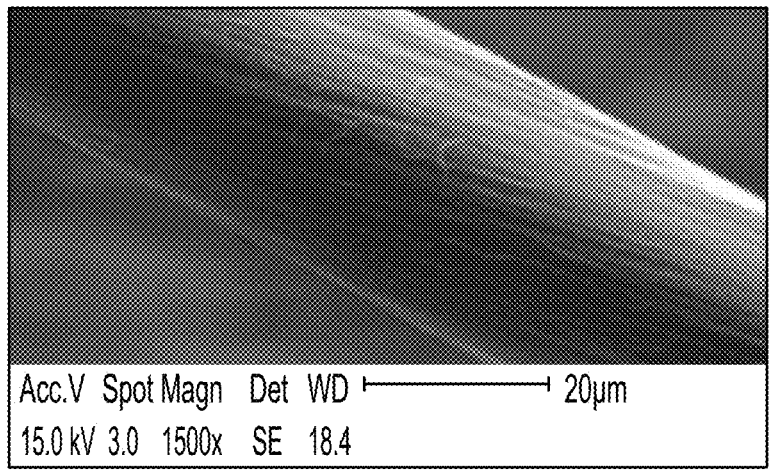
FIG. 1A. SEM image of electrically conducting CNT core.

Nanomaterials, particularly graphene and CNT, are ideal materials for electrochemical sensing applications and have recently have gained significant attention. Due to their intrinsic electrical conductivity and large surface area, electrodes fabricated from CNT bundles, sheets and fibers have shown promising results. Previous work by the present inventors focused on replacing the traditional glassy-carbon used as a working electrode (WE). In more recent studies, the Platinum counter electrode/auxillary electrode was also replaced by a CNT-based counter electrode. In Guo X et al. (*Electroanalysis,* 2011. 23: p. 1252-1259), an entirely different format of CNTs referred to as a CNT tower is disclosed, along with an electrode set with the WE replaced by the CNT tower in conjunction with commercially available RE and CE. Subsequent work is disclosed in Guo, X., et al., *Electroanalysis,* 2013. 25: p. 1599-1604.", which focuses on detecting a single metal, Zn, with an electrode assembly including a CNT-based WE; however otherwise utilizes commercial electrodes for the RE and CE. The most recent published work, Zhao, D., et al., *Electroanalysis,* 2014. 26: p. 488-496, discloses an electrode set with CNT fiber as the WE; however also continues to use commercially standard materials for the RE and CE.

The main challenge for most CNT applications has been limited by the difficulty of assembling CNT into macroscopic electrode formats such as sheets, threads and fibers. Embodiments of the invention, however, exploit the physical properties of the CNT macro-assemblies such as alignment and high purity. CNT ribbons about 50 nm thick are formed from drawable vertical arrays and spun into fibers and threads. Controlled twisting (turns/m) is applied to manufactured CNT fibers and threads. Sheets and films are assembled through layer by layer collection of CNT ribbons and are also employed as electrodes in electrochemical cells. The electrodes disclosed herein are easy to handle, may be fabricated as disposable electrodes, and may be manufactured more cost-efficiently than the standard Pt wires.

An important component that limits many electrochemical sensor applications is the reference electrode (RE). Liquid-based reference electrodes have limited miniaturization potential and are mechanically fragile and therefore not suitable for applications at high pressure and high temperature. An ideal solid-state RE should be rugged and maintenance-free, have a low-temperature coefficient, should possess stability and reliability when compared to a standard RE such as the liquid based saturated calomel electrode (SCE). Further, it should not lead to undesirable contamination of the environment due to the medium or its surroundings. The potential should be stable and reproducible even after small electric current flow, and functioning should be minimally influenced by pH, or concentration of oxygen and redox species in solution.

Traditionally, solution based limitations of Ag/AgCl and $Hg/Hg_2Cl_2$ (Calomel) REs determine whether an electrochemical sensor can be used in alkaline or high temperature environments. Disclosed herein are novel all-carbon electrode sets for electrochemical applications that are based on inert nanomaterials, carbon nanotubes (CNTs). The inventive all-carbon based RE no longer requires metal or metal oxides like traditional Ag/AgCl, instead relies different functional groups that are bonded to the carbon atoms in the CNT. The key innovation of embodiments of the RE is the chemical functionalization of the CNT fiber outer shell that allows reasonable constant comparative potential value. The whole set of electrodes employs metal-free and binder-free CNT fibers as working (WE), counter (CE) and RE. This not only reduces electrode dimensions, but because of the covalent bonded nature of the CNTs, embodiments of the inventive REs are particularly suitable for acidic or alkaline environments.

Among many known solid-state REs, metal within a solid melt salt and all-solid REs are ubiquitous, and the Ag/AgCl RE is most commonly employed in applications that require miniaturization mainly due to the simplicity of construction, safety, greater stability, low oxygen dependence, and small temperature hysteresis. Solid-state REs based on Ag/AgCl provide advantages over the conventional liquid-junction type reference electrode because they do not suffer from the internal filling solution leakage and storage problem of the internal filling solution, since no liquid phase is used. They are also easily fabricated with miniaturized dimensions, which makes them useful for in vivo studies. Solid reference electrodes are heat and pressure resistant, up to 140° C. up to 16 bar overpressure, respectively. However, in the case of the electrochemical systems containing strong alkaline media such as carbohydrate detection after anion exchange separation, or electrochemical studies in alkaline batteries, malfunction of the Ag/AgCl RE is frequently encountered. Further, food industry and biotechnology applications demand REs based on inert material that have the capability to be sterilized at high temperatures and exposed to high atmospheric pressures.

Miniaturization is an important consideration. Reduction in size of the RE is required to facilitate its coupling with microsensors and lab-on-a-chip devices for point-of-care diagnostics. Electronics miniaturization has made possible the fabrication of many on-site testing devices that are becoming more and more important in analytical chemistry. Many tests kits and test strips for environmental analysis are commercially available and there is a trend in medicine towards point of care testing. Disposable sensors or small sensor systems are advantageous in on-site testing applications. For this purpose, inexpensive disposable electrode sets are being developed worldwide, and many innovative designs are currently available. All known sensors, however, require a disposable RE, and depending on the specific application, many are limited to a solid-sate RE option.

Embodiments of the invention provide an "all carbon" based electrochemical electrode set for electrochemical characterization/monitoring and sensing applications that are benefited by miniaturization, portability, compatibility with harsh chemical/process environments and parameters, and durability under high temperature and/or high pressure. Embodiments of the inventive electrodes enable containment into less than millimeter size electrodes for electrochemical applications, and analysis of very small volume samples (less than 1 mL). The electrodes are fabricated from substantially pure carbon nanotube (CNT) fiber and are designed to perform independently as working, reference and auxiliary (counter) electrodes, or together as a three-electrode set. The development of a CNT-based reference electrode as provided herein, has reduced the dimensions of the latter to the micrometer size, does not require the use of an internal filling solution, and substantially cuts the cost when compared to a conventional liquid-junction type reference electrode.

One embodiment is directed to an electrode assembly for electrochemical sensing, the assembly comprising a reference electrode comprising a carbon nanotube (CNT) core consisting of substantially pure CNT. "Core" as used herein should not be construed as implying existence of additional materials and a bare/naked/pristine CNT core is contemplated as within the scope. In specific embodiments, the assembly further comprises a working electrode comprising a CNT core, an auxiliary electrode comprising a CNT core, or both a CNT working electrode and a CNT auxiliary electrode, each CNT core consisting of substantially pure CNT. The CNT core comprises a CNT architecture selected from thread, fiber, film, sheet, and combinations thereof. In very specific embodiments, all electrodes in the assembly comprise fiber CNT core architecture, in other very specific embodiments all electrodes in the assembly comprise sheet CNT core architecture, and in still other very specific embodiments there is a mixture of CNT core architectures among the electrodes.

A key fabrication feature is that CNTs are processed into fibers/and films that preserve the tube alignment of CNTs within the assembly. Transparent and aligned CNT ribbons are formed from drawable vertical arrays and spun into fibers. Controlled twisting (turns/m) is applied to manufactured fibers and threads of CNTs. Sheet and film assembly is accomplished through a layer by layer collection of CNT ribbons to increase the thickness to that suitable for utilization as electrodes in electrochemical cells. These assemblages are electrically conductive, possess a relatively large surface area, and are chemically inert. This property profile makes the CNTs ideal for applications such as heavy metal ion sensing, low volume sample analysis, electrochemical analysis in harsh chemical environments, and under severe pressure parameter challenge. The electrodes are easy to handle, disposable, and may be manufactured cost-effectively. According to embodiments of the invention, all electrodes in an electrochemical cell may be replaced by CNT fibers, providing a highly durable miniaturized microelectrode.

Embodiments provide methods for fabricating a CNT core architecture for use in the inventive electrodes. In the inventive process, CNTs are first assembled as fibers or sheets in their pristine nature of 100% carbon thus no binders, nor dispersants are used. The methods comprise synthesizing a vertically aligned CNT array; and spinning the CNT array into the core architecture. Spinning may comprise dry spinning, wet spinning, electrospinning or extruding from the CNT array. In very specific embodiments the desired core CNT architecture comprises threads or fibers, and spinning comprises dry spinning the threads or fibers from the CNT array to an average diameter of from about 10 microns to about 1,000 microns. In more specific embodiments the threads or fibers are spun to an average diameter of about 30-40 microns. In other very specific embodiments the desired core CNT architecture comprises sheets, and spinning comprises dry spinning the sheets from the CNT array to a thickness of from about 0.05 microns to about 10 microns. In more specific embodiment the thickness is from 0.05 to 5 microns, and in even more specific embodiments the thickness is about 1 micron. For purposes of assessing scope, "about" is plus or minus 5%.

According to specific embodiments, the CNT core of the working electrode comprises an insulating coating. In very specific embodiments the insulating coating comprises a polymer coating, and in more specific embodiments the polymer coating comprises a polystyrene coating. In other specific embodiments, the CNT core of the reference electrode comprises a silver (Ag) plating, and more specifically, the silver plating comprise Ag/AgCl plating. In some embodiments the Ag/AgCl plating is applied to the CNT core by electrochemical deposition, Physical Vapor Deposition (PVD) or Chemical Vapor Deposition (CVD).

According to some embodiments, the fabrication further comprises coating the CNT sheet with a polymer by electrochemical deposition, dipping, plasma polymerization, plasma vapor deposition (PVD), or chemical vapor deposition (CVD). These coating methods are well known to a person of skill in the art. Embodiments provide an electrochemical sensing device comprising an electrode assembly comprising a reference electrode fabricated with a CNT core, an auxiliary electrode fabricated with a CNT core, or both a reference and an auxiliary electrode fabricated with CNT cores, all cores consisting of CNT in a thread/fiber or sheet architecture Embodiments of the invention provide methods for detection and/or quantitative determination of one or more ionic species in a sample. The methods comprise use of the electrode assembly according to claim 1 in an anodic stripping voltammetry (ASV) analysis of the sample. According to specific embodiments, the ionic species comprises one or more species of heavy metal selected from the heavy metals set forth in Table 1, and in very specific embodiments the heavy metal ionic species are selected from one or more of $Hg^{2+}$, $Cu^{2+}$ and $Pb^{2+}$, $Cd^{2+}$, and $Zn^{2+}$, and detection and/or quantitative determination comprises individual or simultaneous analysis. In specific applications, the sample may be municipal water, environmental water, or a solution derived from a hard surface.

The reduced dimensions of the all-carbon CNT material assemblies significantly shrink the electrochemical cell volume setup and therefore decrease the required volume of sample for analysis. Major applications of the novel microelectrodes include the detecting of toxic heavy metals such as lead, cadmium, mercury, arsenic, zinc, copper in drinking water, environmental water from rivers and lakes, and biological samples such as blood and urine.

Methods for conducting an electrochemical analysis of a fluid sample are also provided. Electrode assemblies in accordance with embodiments of the invention may be fabricated in micro scale and may be referred to as microelectrodes. They may be advantageously utilized for analysis of very small sample sizes, including sample having a volume of less than 5 mL, 4 mL, 3 mL, 2 mL and 1 mL.

Embodiments directed to methods for monitoring corrosion of steel embedded in a substrate are also provided. In specific embodiments, the substrate comprises concrete. The methods rely on the highly durable inventive electrodes capable of withstanding the harsh chemical environment and demanding physical parameters associated with steel-reinforced concrete structures such as bridges, road infrastructure, large buildings, and the like. The inventive electrode assemblies, and in particular embodiments of the reference electrode, may be embedded with the steel for monitoring the potential (corrosion) of the embedded steel.

3-dimensional printing techniques have presented an excellent alternative for solid-state RE fabrication. Due to its low cost, simplicity, reduced material wastage, non-contact technique, mask-less approach, rapid prototyping, applicability to various substrates, and the use of inks with low viscosity, 3-D printing of Ag/AgCl REs is a preferred fabrication method. Recently, solid-state Res manufactured by inkjet printing of silver ink followed by electrochemical or wet chemistry AgCl layer formation have gained in popularity. Other methods of solid-state RE fabrication using traditional FET type technology have failed to overcome technical deficiencies.

The present inventors surprisingly discovered that all electrodes in the electrochemical cell can be replaced by CNT fibers without the need of metal/metal oxide. The conventional glassy carbon electrode employed as WE material in electrochemical applications, can be replaced by CNT fiber with the advantage of being flexible and having larger surface area. Other working electrodes like thin mercury film electrode (TMFE) and the hanging mercury drop electrode (HMDE) have been extensively used due to their superior electroanalytical performance. However the toxicity of mercury, regulations and occupational health considerations now restrict the use of mercury as an electrode material, particularly in sensors. Other materials including bare carbon, gold, and iridium, have been used to replace mercury based electrodes, however due to their limited surface area, CNT based WEs can still outperform them. Additionally, common Pt wire used as CE can be replaced by bared CNT fiber and a combination of them can be used as electrochemical sensors.

TABLE 1

| Metals that can be determined by Anodic Stripping Voltammetry | | |
| --- | --- | --- |
| Antimony | Gallium | Mercury |
| Arsenic | Germanium | Silver |
| Bismuth | Manganese | Thallium |
| Cadmium | Indium | Tin |
| Copper | Lead | Zinc |

The following examples are set forth to illustrate particular aspects, features and advantages of embodiments of the invention and should not be construed as limiting the full scope thereof as defined by the appended claims.

Example 1

Carbon Nanotube Synthesis and Fiber Assembly.

The CNT micro-electrode assembly starts with the synthesis of vertically aligned spinnable/drawable CNT arrays. Typically CNTs about 400 µm in length are synthesized with unique density allowing self-assembly into macroscopic fibers. The synthetic process uses thin films of Fe and Co catalyst that are sputtered on 4 inch Si wafers having already a 5 nm $Al_2O_3$ as a buffer layer. The Si wafer substrates were scribed and broken into chips with dimensions 2 inch length and variable width (up to 1.5 inch) that are loaded into a modified commercial CVD reactor ET3000 from CVD Equipment Corporation. The growth process takes place at 740 Torr pressure and 750° C. temperature. The main benefit of drawable CNT arrays is that it allows the assembly of catalyst-free and aligned CNTs into fibers, threads, films and sheets. Typically, CNT ribbon drawing starts at one edge of the CNT array and continues until the CNT array is consumed at the opposite edge. During this process no other chemical or binder is required to assemble individual CNTs into films and fibers. Approximately each linear millimeter of CNT array allows drawing a meter long ribbon.

Example 2

Electrode Preparation

Working Electrode.

Figure 1B:
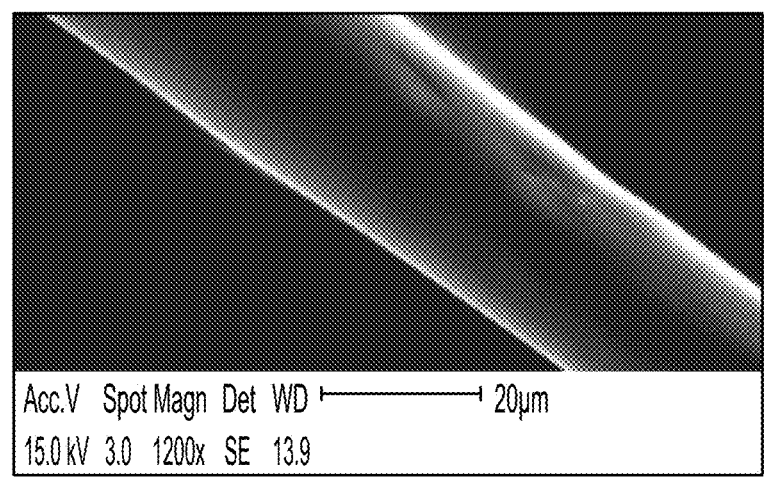
FIG. 1B. SEM image of polymer coated CNT fibers showing the morphology and uniformity of the electrode.

A plain, also called pristine CNT fiber was used as both the working and counter electrode. A CNT thread was connected to a metal wire using silver conductive epoxy. Then, the CNTs thread was entirely coated with polystyrene solution (15 wt % in toluene) and air-dried at 50° C. Further, the polystyrene coated CNTs thread electrode was cut off at the end with a blade. In this way, only the end of the CNTs thread was exposed to the solution. The CNT based microelectrode set has CNTs as electrically conducting cores, where a thin polymer layer is deposited as an insulator. These assemblages can perform either as counter or reference electrode. FIG. 1A and FIG. 1B show SEM images of the conducting CNT core and polymer coating on the CNT surface, respectively.

Ag/AgCl Coated CNT Thread Reference Electrode.

Figure 2A:
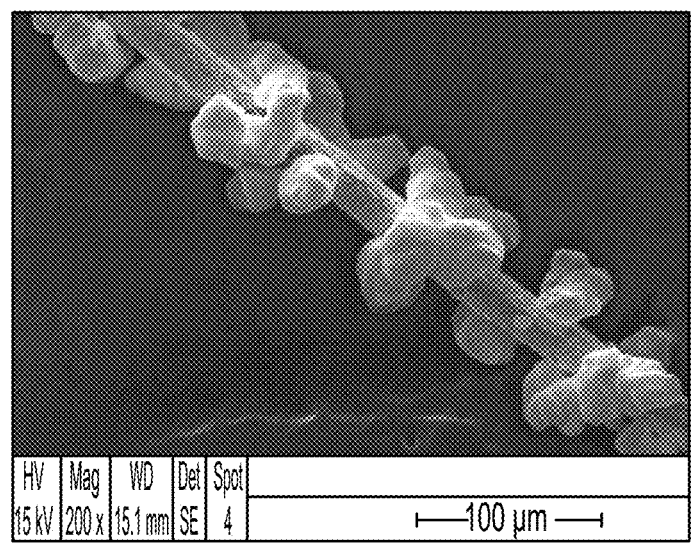
FIG. 2A. SEM image of CNT fiber decorated with Ag/AgCl nanoparticles used as reference electrode.
Figure 2B:
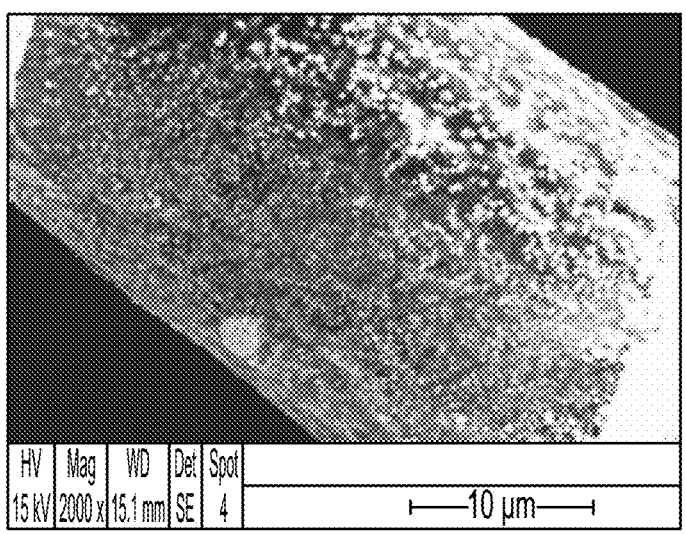
FIG. 2B. SEM image of CNT fiber from (A) at higher magnification of the electrode that displays small nanoparticles on the CNT surface.

Silver electroplating was conducted in accordance with known procedures. The bare CNT thread electrodes were plated using 15 mL 0.3 M $AgNO_3$ in 1M $NH_3$ solution by running the three-electrode cell at room temperature. In the control electrode set, platinum wire and Ag/AgCl (filled with 3 M KCl) were used as auxiliary electrode and reference electrode, respectively, and a CNT thread electrode was used as the working electrode. First, an oxidative pretreatment at 600 mV was applied for 30 s. based on time base technique. General parameters include: Initial potential E=600 mV, Sample Interval=500 ms, Run time=30 s. Second, the plating was driven for 15 min. The parameters are listed as: Initial potential E=600 mV, Sample Interval=500 ms, Run time=900 s. Third, the Ag plated CNTs threads electrode was treated with 50 mM $FeCl_3$ for 50 s. to form AgCl on the surface. Then, the electrode was rinsed with DI water several time and dried with compressed air. FIG. 2A shows SEM images of the Ag/AgCl decorated CNT fibers at low magnification, and FIG. 2B is an SEM image at high magnification.

Figure 3A:
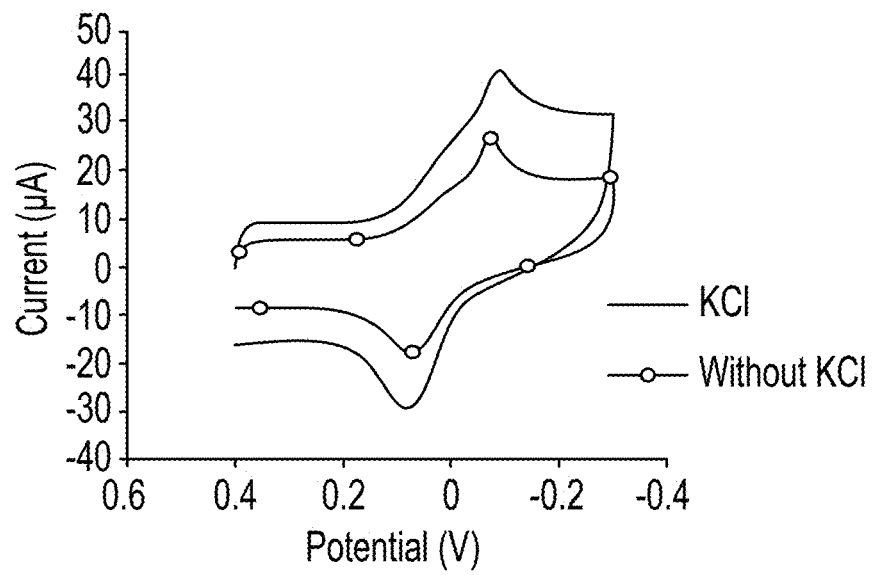
FIG. 3A. Cyclic voltammograms in 5 mM $K_3[Fe(CN)_6]$, 0.1 M acetate buffer, pH 4.5 with scan rates of 100 mV/s at polystyrene and Ag/AgCl coated CNTs thread microelectrodes as working and reference, respectively where bare CNT threads are used as the auxiliary electrode with 5 mM KCl.

Cyclic voltammetry measurements show that electrode performance becomes stable after 15 min electroplating. To test the influence of $Cl^-$ in the solution to Ag/AgCl coated CNT thread reference electrode, the CV was recorded with the addition of KCl into the buffer solution (5 mM KCl). The CV shows that the redox potential of $Fe(CN)_6^{3-/4-}$ does not shift, except when the current is increasing (FIG. 3A). The increased current is due to the conductivity increases with the addition of KCl. The CVs test demonstrates that Ag/AgCl coated CNTs and uncoated CNTs threads used as reference electrode and auxiliary electrode work very well compared to the conventional Ag/AgCl reference electrode and Pt wire auxiliary electrode. The tips of the CNT thread electrode are much smaller (in the scale of 30 µm) compared to Pt wire and conventional liquid-junction type Ag/AgCl reference electrodes. The employment of these two electrodes reduces the dimension of the conventional three electrode system and can provide good spatial resolution, which consumes fewer samples. In addition, these CNT thread electrodes has potential to cut costs compared to commercial Ag/AgCl reference electrode and Pt wire auxiliary electrode.

When the Ag/AgCl coated CNTs thread electrode is used as reference instead of commercial Ag/AgCl reference electrode and Pt wire as auxiliary electrode, the half potential shifts around 180 mV to the negative potential, the peak to peak separation is about the same 118 mV, although the peak current is smaller. The peak to peak separation $\Delta E_p$ is 109 mV, with the $I_{pc}/I_{pa}$=1.87 in the case of Ag/AgCl coated CNTs threads used as reference electrode, and CNTs threads employed as the auxiliary electrode.

Figure 3B:
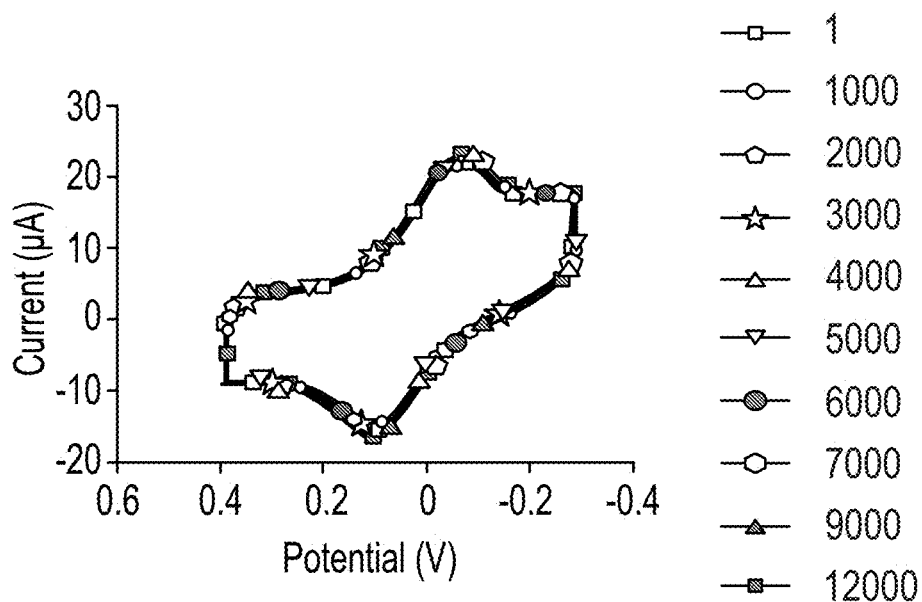
FIG. 3B. scans at 1 to 12,000 cycles at 200 mV/s.

To test stability of Ag/AgCl coated CNT threads as reference electrodes and CNT threads as auxiliary electrodes, the CVs at these CNTs thread electrode were recorded for 12,000 cycles (~23.5 hours). The obtained data demonstrated that all the electrodes exhibit a stable behavior by providing relatively constant potential and current even after 12,000 cycles (FIG. 3B) These results prove that the Ag/AgCl coated CNTs thread electrode used as reference electrode and bare CNT threads employed as auxiliary electrode are very stable and capable for the electroanalytical applications.

Auxiliary Electrode.

Figure 4:
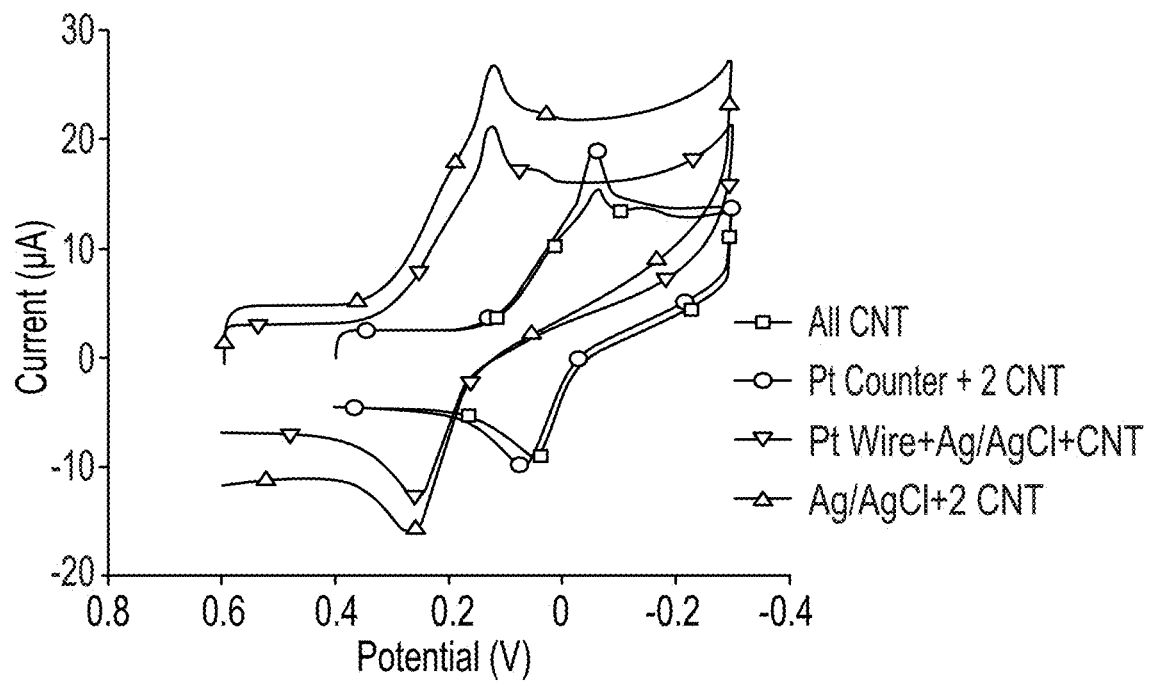
FIG. 4. Cyclic voltammograms using CNT thread microelectrode in 5 mM $K_3[Fe(CN)_6]$, 0.1 M acetate buffer, pH 4.5 with scan rate of 100 mV/s, showing comparison of polystyrene coated Ag/AgCl and bare CNT thread electrode, as working electrode, reference and auxiliary electrode, respectively with Pt wire auxiliary electrode and conventional liquid-junction type Ag/AgCl reference electrode.

The CNT thread was connected to a metal wire by silver conductive epoxy and used as auxiliary electrode. To evaluate the electrochemical properties of the CNT thread electrode, cyclic voltammetry (CV) in 5 mM $K_3[Fe(CN)_6]$ was performed, since electron transfer of $Fe(CN)_6^{3-/4-}$ is especially sensitive to the nature of the electrode surface chemistry and has been commonly used to study the surface of carbon electrodes. FIG. 4 shows the CV at the polystyrene coated CNT electrode as working electrode, with the commercial conventional liquid-junction type Ag/AgCl reference electrode and Pt wire as auxiliary electrode. The peak to peak separation ($\Delta Ep$) is 123 mV, with the $I_{pc}/I_{pa}$ 1.69. In the case of Pt wire replaced by uncoated CNTs threads as counter electrode, $\Delta E_p$ is 141 mV, with the $I_{pc}/I_{pa}$ 1.68. It is clearly that uncoated CNT thread used as auxiliary electrode shows similar performance compared to Pt wire counter electrode. Importantly, the cost for the CNTs threads is much lower compared to Pt wire as auxiliary electrode.

Example 3

Performance in Stripping Analysis

Analytical Procedure.

Stripping analysis consists of two main steps: accumulation and stripping. The accumulation time, or deposition time was 2 min. unless specified otherwise. After depositing metals on a coated CNTs threads electrode, the reduced metals were stripped off using Osteryoung square-wave stripping voltammetry (OSWSV) using the following parameters: step potential=4 mV; S. W. amplitude=25 mV; frequency=15 Hz. The stripping peak currents were used to quantify the metals after baseline correction by the BASi. The stripping peak potentials were employed to assign the metals. Prior to each measurement, the electrode was cleaned at 800 mV for 150 s. to remove any deposit from the previous measurement.

Figure 5A:
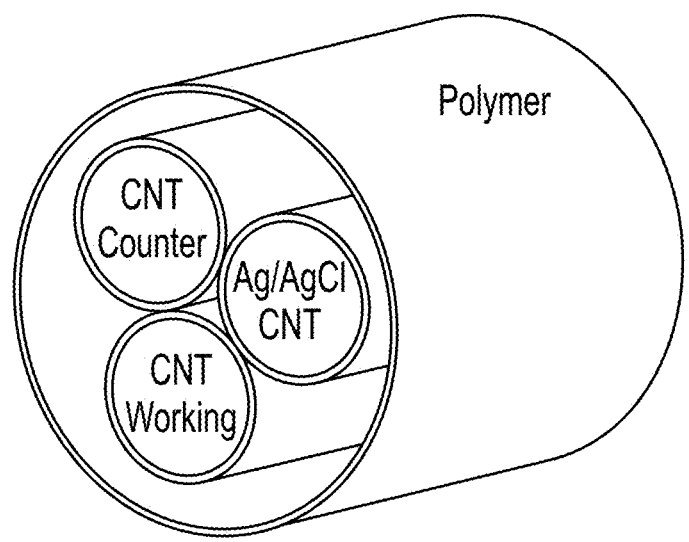
FIG. 5A. Schematic of cross-section of CNT based electrode for heavy metal ion detection by ASV.
Figure 5B:
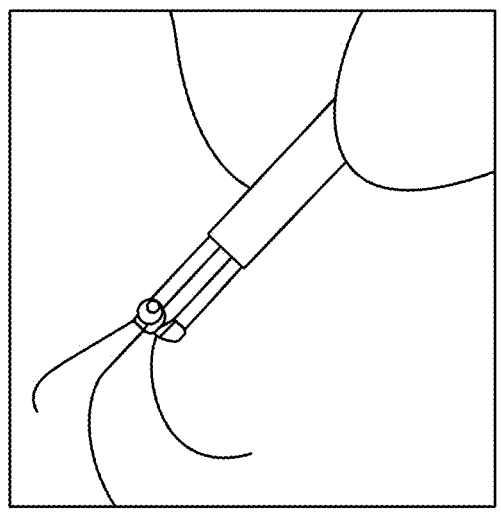
FIG. 5B. picture of all CNT microelectrode set for electroanalysis.

Typical electrochemical cells use a three-electrode configuration that has Pt wires as working and auxiliary electrodes, and commercial Ag/AgCl as a reference electrode. The novel ASV sensing method replaces all electrodes with CNT fiber based electrodes and then assembles them into a smaller set of 3 electrodes that requires significantly reduced sample volume. FIG. 5A illustrates the concept and one of the simplest geometrical designs, although multiple other designs such as thin film, coaxial arrangements are in progress. FIG. 5B sets forth a picture of an inventive embodiment comprising an all-carbon microelectrode set.

Figure 6A:
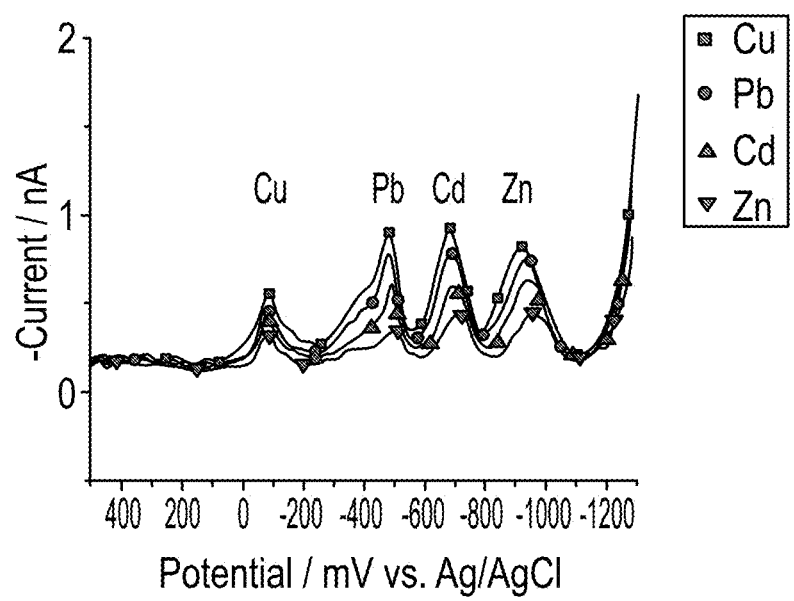
FIG. 6A. Multi-ion detection data using a CNT working electrode demonstrating ASV detection of Cu, Pb, Cd and Zn.
Figure 6B:
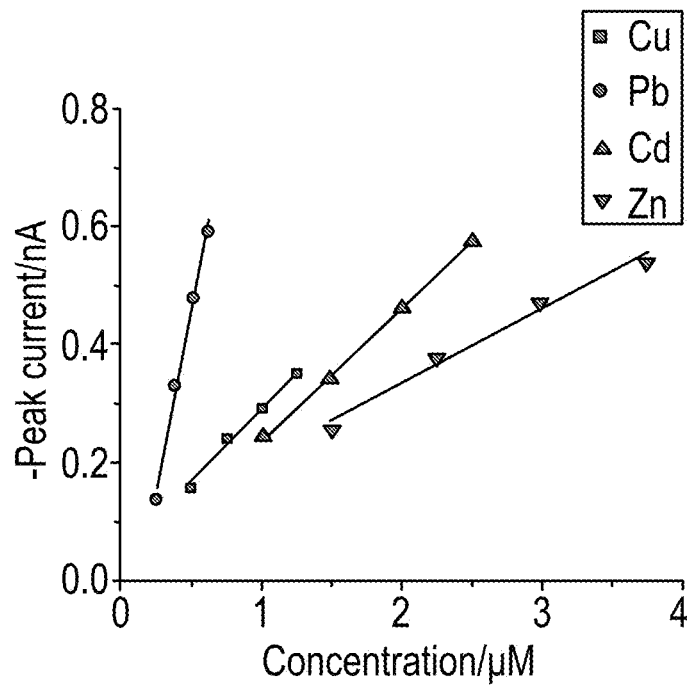
FIG. 6B. calibration curves for each ion detection.
Figure 6C:
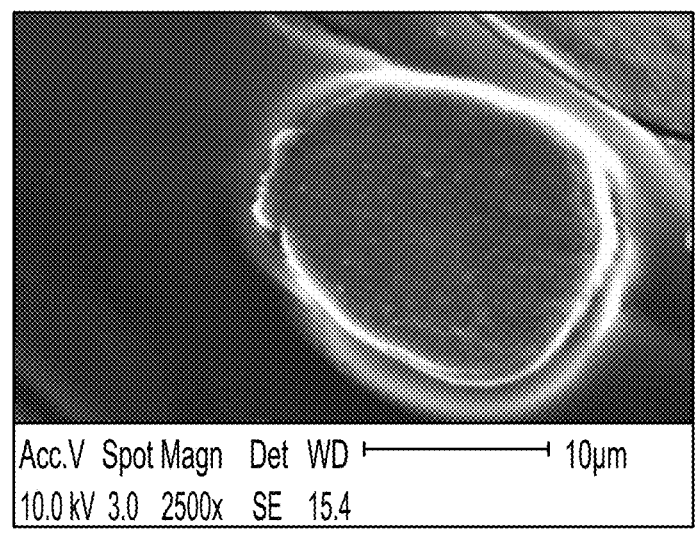
FIG. 6C. SEM image of the CNT micro-cable used as a sensor for the data collection.

The present inventors first reported a CNT thread WE electrode for ASV in 2013, which demonstrated the detection of zinc ion. A CNT fiber electrode able to detect multiple metals in solution to down subnanomolar level was also previously reported, (FIG. 6A and FIG. 6B). In that work a CNT fiber was utilized as the working electrode for ASV detection of four metal ions (FIG. 6C): $Cu^{2+}$, $Pb^{2+}$, $Cd^{2+}$ and $Zn^{2+}$; however commercial auxiliary (CE) and reference electrodes (RE) were employed.

Individual Metal Ion Detection.

Figure 7A:
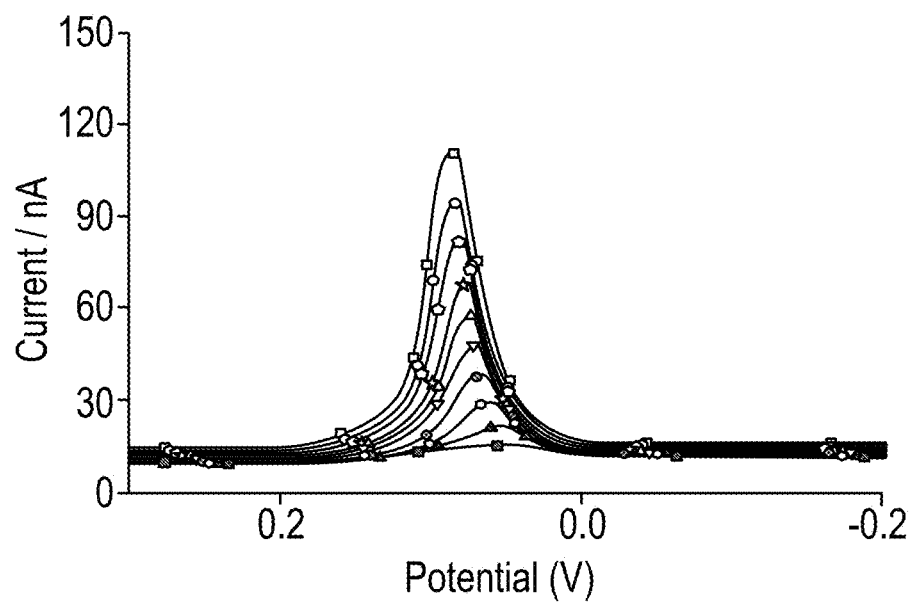
FIG. 7A. OSWSV stripping voltammograms for $Hg^{2+}$, $Cu^{2+}$ and $Pb^{2+}$ in 0.1 M acetate buffer at CNTs threads electrode—1.5, 2.0, 2.5, 3.0, 3.5, 4.0, 4.5, 5.0, 5.5, 6.0 μM of $Hg^{2+}$.
Figure 7B:
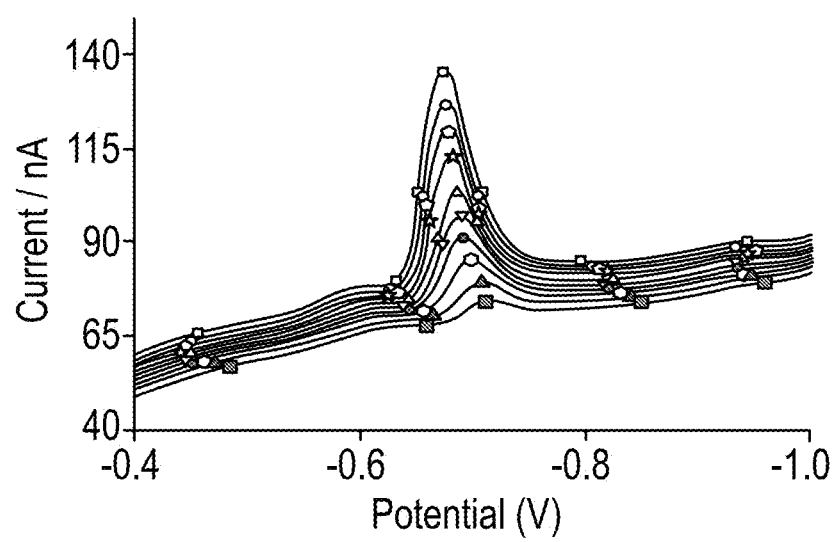
FIG. 7B. 4.0, 4.5, 5.0, 5.5, 6.0, 6.5, 7.0, 7.5, 8.0, 8.5 μM of $Cu^{2+}$.
Figure 7C:
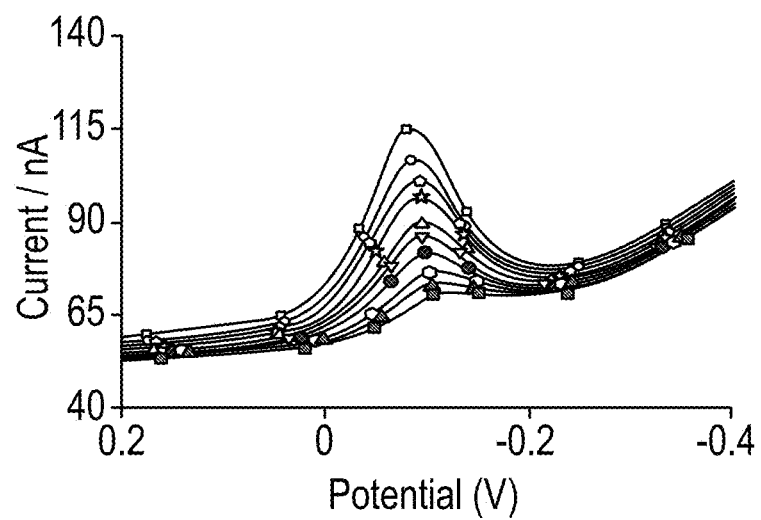
FIG. 7C. 1.0, 1.5, 2.0, 2.5, 3.0, 3.5, 4.0, 4.5, 5.0, 5.5 μM of $Pb^{2+}$ Accumulation time: 120 s; deposition potential: −1.2 V.

Under optimized conditions, and electrode set with the polystyrene-coated CNT thread electrode as the working electrode, Ag/AgCl coated CNTs thread as the reference electrode and an uncoated CNT thread as the counter electrode, was tested for $Hg^{2+}$, $Cu^{2+}$ and $Pb^{2+}$ detection by ASV. Well-defined stripping peaks were obtained for all $Hg^{2+}$, $Cu^{2+}$ and $Pb^{2+}$, respectively (FIG. 7A, FIG. 7B, and FIG. 7C). $Hg^{2+}$ and $Pb^{2+}$ exhibit sharper stripping peak compared to $Cu^{2+}$. The peak current increases linearly versus $Hg^{2+}$, $Cu^{2+}$ and $Pb^{2+}$ concentration. The correlation equations are $I_p$=(21.3±1.1)C−(26.6±2.1) ($R^2$=0.992), $I_p$=(8.9±0.2)C−(35.357±0.5) ($R^2$=0.999); and $I_p$=(11.7±0.6)C−(8.9±1.0) ($R^2$=0.990) for $Hg^{2+}$, $Cu^{2+}$ and $Pb^{2+}$, respectively. Here, $I_p$ is the stripping peak current (nA) and C is the concentration of $Hg^{2+}$, $Cu^{2+}$ and $Pb^{2+}$ (µM). The sharp well defined stripping peaks are at 84 mV, −88 mV and −676 mV for $Hg^{2+}$, $Cu^{2+}$ and $Pb^{2+}$, respectively. Compared to the uncoated CNT thread electrode as working electrode, commercial liquid-junction Ag/AgCl (3 M KCl) as the reference electrode and Pt wire as auxiliary electrode, maximum of the peak shifts to the negative potential for 112 mV and 188 mV for $Cu^{2+}$ and $Pb^{2+}$, respectively.[31] The potential shift is consistent with the CV measurement using Ag/AgCl coated CNT thread as reference electrode. The calculated detection limits (based on the 3σ method) are 1.05 nM, 0.53 nM and 0.57 nM for $Hg^{2+}$, $CU^{2+}$ and $Pb^{2+}$, respectively. The detection limits of these three metal ions in water are well below the allowable limits instituted by United States Environmental Protection Agency (EPA) (Hg, 9.97 nM, Cu: 20.45 μM and Pb, 72.39 nM) and by the World Health Organization (WHO) listed Hg: 29.90 nM, Cu: 31.47 μM and Pb, 48.26 nM). From the slopes of the calibration plots, the calculated sensitivity was determined to be highest for Hg, followed by Pb, and least for Cu. It was also noticed that the sensitivity for Cu is higher than for Pb compared to uncoated the CNT thread electrode. At the same time, the sensitivity of CNT thread coated with polystyrene increases about 15 times and 27 times for Cu and Pb, respectively. The selectivity for the Pb is higher than Cu after polystyrene coating of the CNT thread electrode. The increased sensitivity for Cu and Pb and the higher selectivity for Pb are related to the change of surface characteristics and composition of the CNT thread electrode with the polystyrene coating. Importantly, the diameters of the CNT threads (~34 μm) increase about 5 times compared to earlier work (~7 μm). It has been demonstrated that the dimensions of CNTs affect the pre-concentration efficiency toward metal ions in aqueous solution. Although the polystyrene polymer coating is non-conducting, it changes the surface characteristics of the electrode sidewalls. At the same time, the hydrophobic properties of the electrodes do change, which probably affects the electron transfer rate. Earlier work demonstrated that polystyrene coated CNT tower electrode shows the higher sensitivity for Pb compared to Cu. $NH_3$ plasma treated CNT glassy carbon electrode shows the higher sensitivity for Hg, Cd and Cu compared to untreated CNT modified glassy carbon electrode. At the same time, the sensitivity for Hg is higher than for Cu after the modification of the plasma treated electrode. However, several research groups reported a reverse trend. A hollow fiber-supported sol-gel electrode with multiwall CNTs was demonstrated to achieve higher sensitivity for Cu compared to Pb under similar conditions. A gold nanoparticle film modified with CNTs electrode was reported to give higher sensitivity for Cu compared to Pb. Morton et al. described higher sensitivity for Pb than Cu using functionalized carbon nanotube modified electrode. Schiff base treated CNT electrode shows higher sensitivity for Pb than Hg. Taken all together, the higher sensitivity to Pb in this embodiment of the inventive electrode set is highly related to the composition of polystyrene coated CNT electrode and its effect on the rate of electron transfer.

Simultaneous Detection of Hg, Cu and Pb.

Figure 8:
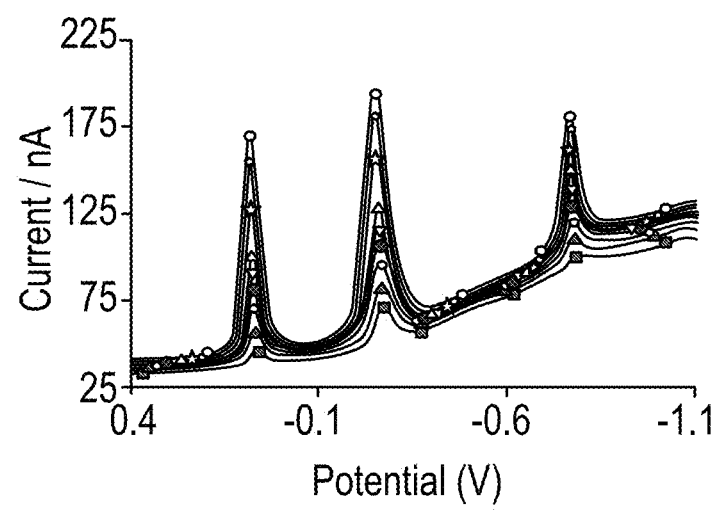
FIG. 8. OSWSV stripping voltammograms for simultaneous detection of $Hg^{2+}$, $Cu^{2+}$ and $Pb^{2+}$ using CNT threads electrode at concentrations 1.0, 1.5, 2.0, 2.5, 3.0, 3.5, 4.0, 4.5, 5.0 μM of $Hg^{2+}$ and $Pb^{2+}$; 3.0, 4.5, 6.0, 7.5, 9.0, 10.5, 12.0, 13.5, 15.0 μM of $Cu^{2+}$.

The stripping voltammograms for simultaneous detection of $Hg^{2+}$, $Cu^{2+}$ and $Pb^{2+}$ at different concentrations are shown in FIG. 8. The three peaks are well resolved and the peak current increases linearly with the increase of concentration of $Hg^{2+}$, $Cu^{2+}$ and $Pb^{2+}$. The correlation equations are: $I_p=(29.0\pm2.8)C-(29.8\pm3.9)$ ($R^2=0.959$); $I_p=(17.8\pm0.7)C-(16.4\pm1.3)$ ($R^2=0.990$); and $I_p=(9.9\pm1.7)C-(21.7\pm1.9)$ ($R^2=0.960$), respectively. Compared to the detection of individual metal ions, the presence of Hg increases the sensitivity for Cu and Pb. The increased sensitivity for Cu and Pb is due to the formation of the mercury thin film and amalgam. It is known that the formation of an amalgam in mercury electrodes increases the sensitivity because of its ability to eliminate background interferences.

Example 4

Characterization of an Embodiment of an Inventive Reference Electrode.

Reference Electrode.

Figure 9:
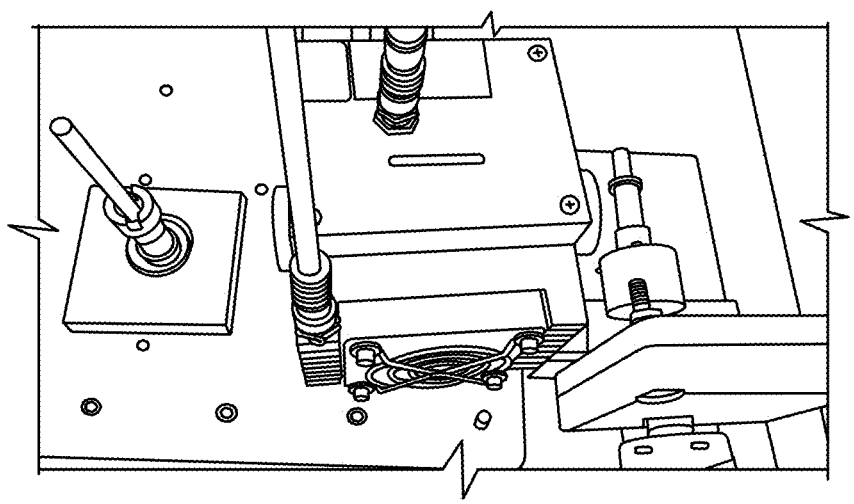
FIG. 9. Photograph of a CNT fiber functionalization setup showing an Aluminum bobbin to the left which delivers the CNT fiber that goes through the plasma chamber and exits to the other side of the chamber to be collected on the fiber collection bobbin.

CNT fiber was functionalized in a continuous format as shown in FIG. 9, where 45 m long CNT fiber on bobbin to the left is fed to the cylindrical plasma chamber (Surfx) and functionalized CNT fiber is collected onto bobbin to the right at 0.3 m/min. General plasma parameters include: RF generator operating at 13.5 MHz, power (120 W) and active plasma source gases were delivered directly to the chamber, 15 L/min of He (99.999% purity) and 0.4 L/min $O_2$ (99.999% purity). The RE was assembled within glass capillaries in a similar manner to the WE and CEs, a picture of whole electrode is shown in FIG. 5B.

Figure 10:
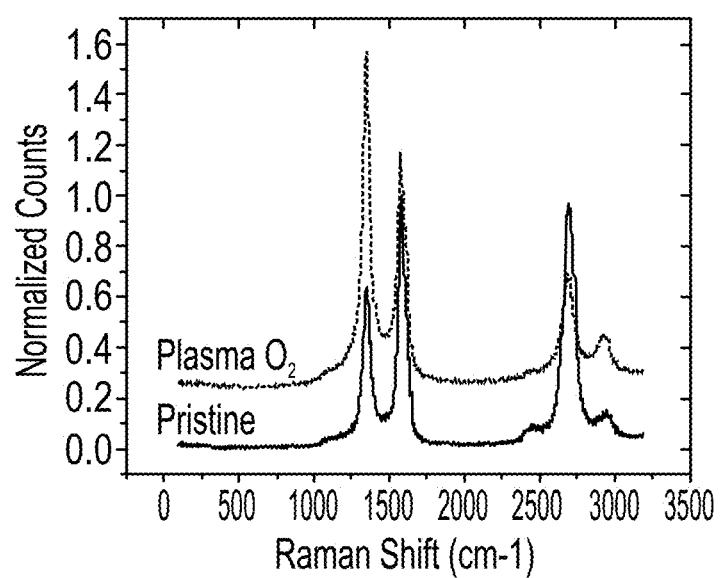
FIG. 10. Raman spectra of pristine and $O_2$ plasma functionalized CNT fiber (514 nm).
Figure 11:
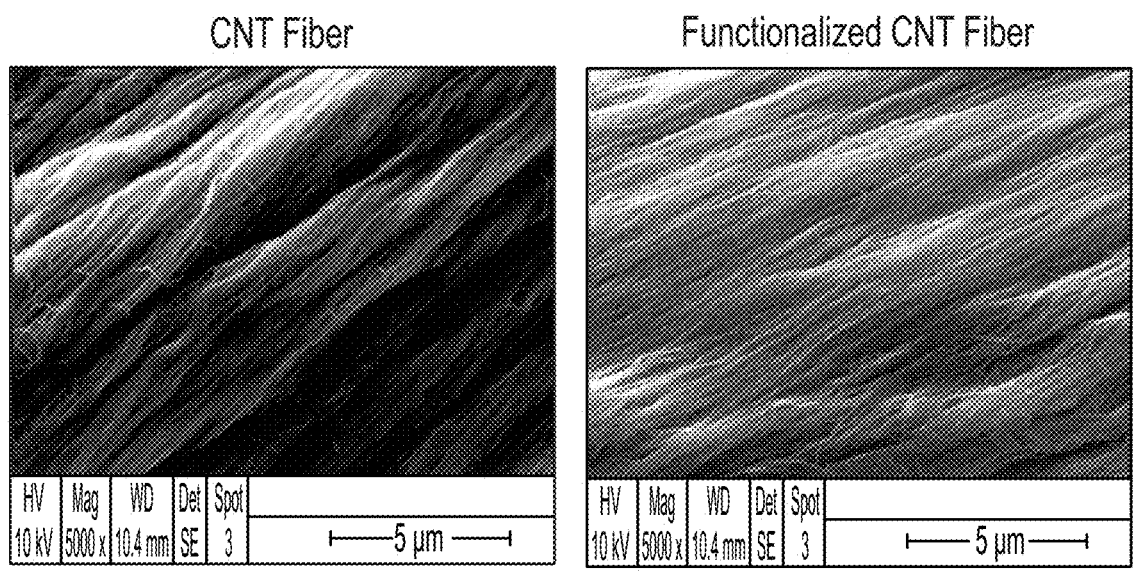
FIG. 11. SEM images of the CNT fiber before and after $O_2$ plasma functionalization.

Characterization of the functionalized CNT fiber were carried through Raman spectroscopy where respective D-band (1350 $cm^{-1}$), G-band (1585 $cm^{-1}$) and G'-band (2700 $cm^{-1}$) are shown in FIG. 10 before (pristine) and after functionalization. The G band that represents the $sp^2$ nature of CNTs indicative crystallinity and quality of the CNTs that is predominant in pristine CNTs was completely inverted through functionalization. D-band that shows the presence of $sp^3$ or single bonded by carbon atoms which indicative of defects and broken $sp^2$ bonds became predominant after $O_2$ functionalization of CNTs fibers. The G' band that sometimes is claimed as indicative of the metallicity of the CNT fibers, also decreased after functionalization. It is evident that $O_2$ plasma functionalization of CNTs results in creation of defects on the sidewalls, therefore the $I_D/I_G$ ratios ~0.6 in pristine becomes ~1.3 after functionalization. SEM images (FIG. 11) taken before and after functionalization does not show significant difference between samples, except the more charging during micrograph collection was noted. Since functionalization is at the atomic level, as expected SEM images does not reveal obvious difference between samples.

Figure 12:
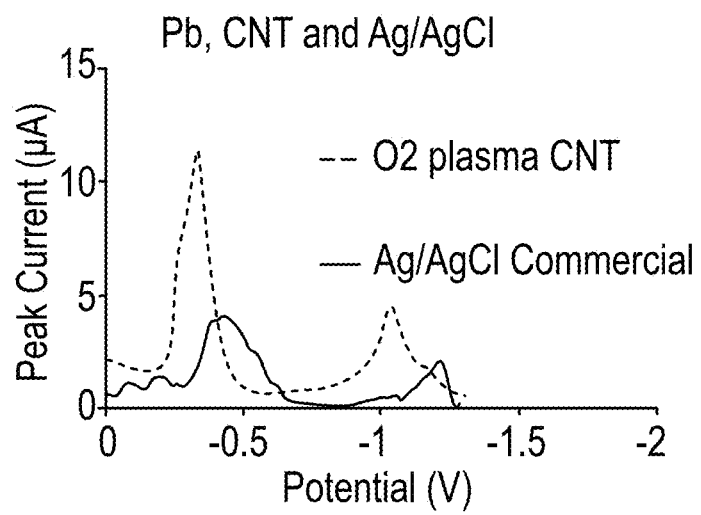
FIG. 12. Pb detection through ASV (0.8 uM) setting forth a comparison of the $O_2$ plasma functionalized CNT fiber and commercial Ag/AgCl as reference electrodes.

Functionalized CNT performance as a RE was tested for $Pb^{2+}$ ion detection $H_2O$ using ASV where commercial Ag/AgCl electrode was replaced by the CNT all-carbon RE. ASV consists of two main steps: accumulation and stripping. The accumulation time, or deposition time was 2 min. unless specified otherwise. After depositing metals on a coated CNT thread electrode, the reduced metals were stripped off using Osteryoung square-wave stripping voltammetry (OSWSV) using the following parameters: step potential=4 mV; S. W. amplitude=25 mV; frequency=15 Hz. The stripping peak currents were used to quantify the metals after baseline correction by the BASi. The stripping peak potentials corresponds to the $Pb^{2+}$ as is shown in FIG. 12, which shows a direct comparison between a commercial Ag/AgCl RE and the functionalized CNT-RE. As expected for a different material, a ~150 mV potential shift is observed between the peaks collected using these two REs.

Figure 13:
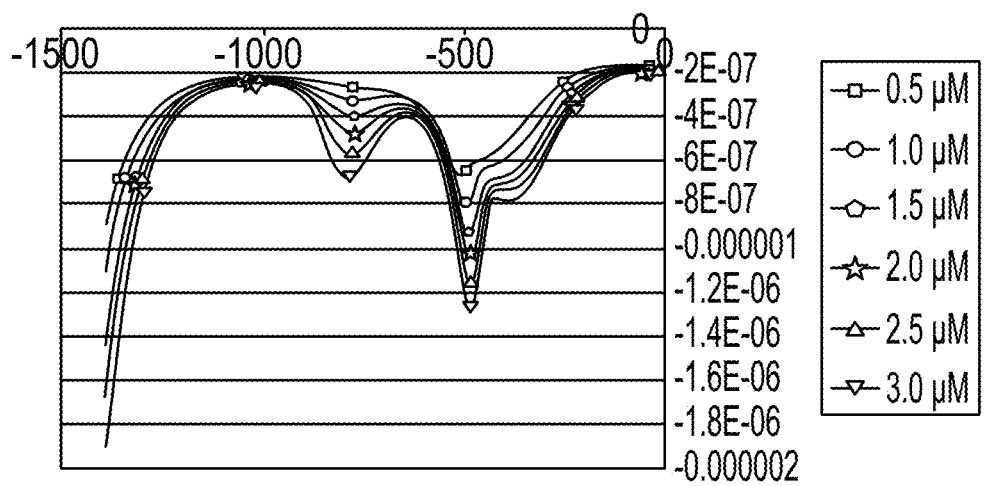
FIG. 13. Pb detection through ASV with all-carbon based electrode set; $O_2$ plasma functionalized CNT fiber is used as reference electrode while pristine CNT fiber was used as working and counter electrodes.

Additionally, 0.5, 1.0, 1.5, 2.0, 2.5 and 3.0 uM $Pb^{2+}$ solutions were prepared and detection of $Pb^{2+}$ concentration was tested using all-carbon set of electrodes. Pristine CNT fibers were used as working and counter electrodes, while functionalized CNT fiber was used as RE. Gradual increase of peak potential was observed as the $Pb^{2+}$ concentration increases as shown in FIG. 13. These results support that metal/metal oxide free electrode can be used as RE, as well the entire electrode set is based on CNT fibers, with potential for further miniaturization. It also supports that CNTs fiber electrodes are very stable and capable for the electroanalytical applications. Prior similar works using functionalized CNTs have been limited to the application as WE, but not as RE. $NH_3$ plasma treated CNT electrode shows the higher sensitivity for Hg, Cd and Cu compared to pristine CNT electrode. Morton et al. described higher sensitivity for Pb than Cu using functionalized carbon nanotube modified electrode. Schiff base treated CNT electrode shows higher sensitivity for Pb than Hg. Taken all together, the higher sensitivity to Pb in our invention is highly related to the composition of polystyrene coated CNT electrode and its effect on the rate of electron transfer.

What is claimed:

1. An electrode assembly for electrochemical sensing, the electrode assembly comprising:
    a reference electrode comprising a core portion and a plating on an exterior of the core portion,
        the core portion comprising an aligned assembly of carbon nanotube fibers;
        each carbon nanotube fiber having a diameter of at least 10 micrometers and comprising a plurality of carbon nanotubes spun together;
        the core portion being metal free and binder free; and
        the plating being an Ag/AgCl plating.

2. The electrode assembly of claim 1, further comprising a working electrode, an auxiliary electrode, or both a working electrode and an auxiliary electrode, wherein the working electrode when present and the auxiliary electrode when present comprise a core consisting of substantially pure carbon nanotubes.

3. The electrode assembly of claim 2, wherein the working electrode comprises an insulating coating on the core.

4. The electrode assembly of claim 3, wherein the insulating coating comprises a polymer coating.

5. The electrode assembly of claim 4, wherein the polymer coating comprises a polystyrene coating.

6. The electrode assembly of claim 1, wherein the Ag/AgCl plating is applied to the CNT core by electrochemical deposition, Physical Vapor Deposition (PVD) or Chemical Vapor Deposition (CVD).

7. The electrode assembly of claim 1, wherein each carbon nanotube fiber has a diameter from 30 micrometers to 40 micrometers.

8. A method for detection and/or quantitative determination of one or more ionic species in a sample, the method comprising use of the electrode assembly according to claim 1 in an anodic stripping voltammetry (ASV) analysis of the sample.

9. The method according to claim 1, wherein the one or more ionic species comprises heavy metal ionic species selected from one or more of $Hg^{2+}$, $Cu^{2+}$ and $Pb^{2+}$, $Cd^{2+}$, and $Zn^{2+}$ and detection and/or quantitative determination comprises individual or simultaneous analysis.

10. The method according to claim 8, wherein the sample comprises municipal water, environmental water, or is derived from a hard surface.

* * * * *

UNITED STATES PATENT AND TRADEMARK OFFICE
CERTIFICATE OF CORRECTION

PATENT NO.       : 11,307,163 B2
APPLICATION NO.  : 15/625249
DATED            : April 19, 2022
INVENTOR(S)      : Noe Alvarez et al.

It is certified that error appears in the above-identified patent and that said Letters Patent is hereby corrected as shown below:

On the Title Page

Item (72), inventor 2, delete "Daoli Zhao, I" and insert --Daoli Zhao--, therefor.

In the Specification

In Column 2, Line(s) 60, delete "are" and insert --area--, therefor.

In Column 3, Line(s) 10, delete "petentiometric" and insert --potentiometric--, therefor.

In Column 3, Line(s) 20, delete "stablity" and insert --stability--, therefor.

In Column 5, Line(s) 66, delete "auxillary" and insert --auxiliary--, therefor.

Signed and Sealed this
Tenth Day of January, 2023

Katherine Kelly Vidal
*Director of the United States Patent and Trademark Office*